US009954363B2

(12) United States Patent
McCullough et al.

(10) Patent No.: US 9,954,363 B2
(45) Date of Patent: Apr. 24, 2018

(54) WHOLE HOUSE AND POWER SYSTEM ANALYSIS VIA GRID CONNECTED APPLIANCE

(71) Applicant: Battelle Memorial Institute, Columbus, OH (US)

(72) Inventors: Jason McCullough, Columbus, OH (US); Eric Rehberg, Westerville, OH (US)

(73) Assignee: BATTELLE MEMORIAL INSTITUTE, Columbus, OH (US)

(*) Notice: Subject to any disclaimer, the term of this patent is extended or adjusted under 35 U.S.C. 154(b) by 224 days.

(21) Appl. No.: 15/091,874

(22) Filed: Apr. 6, 2016

(65) Prior Publication Data

US 2016/0315472 A1 Oct. 27, 2016

Related U.S. Application Data

(60) Provisional application No. 62/152,418, filed on Apr. 24, 2015.

(51) Int. Cl.

*H01H 47/00* (2006.01)
*H01H 35/00* (2006.01)
*H01H 83/18* (2006.01)
*H02H 3/02* (2006.01)
*H02H 3/42* (2006.01)

(Continued)

(52) U.S. Cl.

CPC ............ *H02J 3/00* (2013.01); *G01R 19/2513* (2013.01); *Y02E 60/74* (2013.01); *Y04S 10/30* (2013.01)

(58) Field of Classification Search

USPC .......................................... 307/31, 125, 126

See application file for complete search history.

(56) References Cited

U.S. PATENT DOCUMENTS 2,700,757 A 1/1955 Bradley
3,946,243 A 3/1976 Anderson et al.

(Continued)

OTHER PUBLICATIONS

Bischke et al.; Design and Controlled Use of Water Heater Load Management; IEEE Transactions on Power Apparatus and Systems; vol. PAS-104; No. 6; pp. 1290-1293; Jun. 1985.

(Continued)

*Primary Examiner* — Adam Houston

(74) *Attorney, Agent, or Firm* — Richard M. Klein; Fay Sharpe LLP

(57) ABSTRACT

A load controller is connected with a residential electric load to regulate electric power drawn by the load from a residential a.c. electric power distribution system via power input terminals of the load. A voltmeter is connected to measure voltage at the power input terminals, and an ammeter is connected to measure electric current at the power input terminals. A microprocessor or microcontroller is programmed to compute a source impedance of the power distribution system as seen from the power input terminals using measured voltage and electric current at the power input terminals. The source impedance may be computed by determining an equivalent source voltage as equal to measured voltage at the power input terminals when the electric current at the power input terminals is zero, and computing the source impedance from measured non-zero electric current at the power input terminals in combination with at least the equivalent source voltage.

28 Claims, 2 Drawing Sheets

59
Aggregation demand response controller
56
Power transformer
10
240V
Electric meter
12
240V
14
120V leg
Service panel
120V leg
58
Other load 240V
22
240V
24
Other load 120V
26
Other load 120V
32
34
20
50
30
38
36
$R_{EHW}$
52
54
40

(51) Int. Cl.
*H02J 3/00* (2006.01)
*G01R 19/25* (2006.01)

(56) References Cited

U.S. PATENT DOCUMENTS 7,839,027 B2 11/2010 Shelton et al.
8,121,742 B2 2/2012 Flohr et al.
8,178,997 B2 5/2012 Talkin et al.
8,204,633 B2 6/2012 Harbin, III et al.
8,234,876 B2 8/2012 Parsonnet et al.
8,271,143 B2 9/2012 Deivasigamani et al.
2005/0017847 A1* 1/2005 Bonicatto .............. G01D 4/004 375/356
2005/0020232 A1* 1/2005 Bonicatto ................ H04B 3/54 455/402
2005/0168326 A1* 8/2005 White, II ................. H04B 3/54 370/475
2005/0169056 A1* 8/2005 Berkman ............... G02B 6/483 365/185.22
2006/0071776 A1* 4/2006 White, II ............ H02J 13/0086 340/538
2007/0002771 A1* 1/2007 Berkman ............... H04B 3/542 370/257
2007/0109121 A1* 5/2007 Cohen ................ G06K 19/0707 340/539.26
2010/0295305 A1* 11/2010 Mahawili .............. F03D 7/0244 290/44
2011/0071694 A1* 3/2011 Mammone ............. G06Q 30/02 700/291
2013/0201316 A1* 8/2013 Binder .................... H04L 67/12 348/77
2014/0053560 A1* 2/2014 Simpkin ................... F02C 1/06 60/726
2014/0096946 A1* 4/2014 Rognli ................... F24F 11/006 165/209
2014/0105584 A1* 4/2014 Flohr .................... F24H 9/2021 392/441
2015/0256019 A1* 9/2015 Pate ...................... H02J 7/0068 307/48
2015/0280456 A1* 10/2015 Kesler ..................... H02J 5/005 307/78
2015/0326023 A1* 11/2015 Adelberger ............... H02J 5/00 307/24
2016/0079752 A1* 3/2016 Matan ....................... H02J 3/00 307/24
2016/0079757 A1* 3/2016 Matan ..................... H02J 3/382 307/24
2016/0204606 A1* 7/2016 Matan ....................... H02J 3/38 700/291
2016/0315472 A1* 10/2016 McCullough ............. H02J 3/00
2016/0341120 A1* 11/2016 Simpkin ................... F02C 1/05
2017/0067947 A1* 3/2017 Corum .................... H02J 50/40
2017/0117708 A1* 4/2017 Wang ........................ H02J 3/00
2017/0180062 A1* 6/2017 Johansen ............. H04B 17/102
2017/0273157 A1* 9/2017 Weightman ............ H05B 37/02
2017/0331899 A1* 11/2017 Binder .................... H04L 67/12
2017/0338692 A1* 11/2017 Forbes, Jr. ......... G05B 13/0255
2017/0338693 A1* 11/2017 Forbes, Jr. ......... G05B 13/0255
2017/0344045 A1* 11/2017 Forbes, Jr. ................ G05F 1/66

OTHER PUBLICATIONS

CERTS—Load as a Reliability Resource in Restructured Electricity Markets; California Energy Commission, Consultant Report; Oct. 2003.

Gardner et al; Load Management DSM: Past, Present & Future; Proceedings of the Ninth Symposium on Improving Building Systems in Hot and Humid Climates; pp. 267-279; Arlington, TX; May 19-20, 1994.

Laurent et al.; A Column Generation Method for Optimal Load Management via Control of Electric Water Heaters; IEEE Transactions on Power Systems; vol. 10; No. 3; pp. 1389-1400; Aug. 1995.

Navid-Azarbaijani; Load Model and Control of Residential Appliances; Thesis submitted to the Faculty of Graduate Studies and Research; Department of Electrical Engineering, McGill University, Montreal, Canada; Aug. 1995.

NERC—Balancing and Frequency Control, A Technical Document Prepared by the NERC Resources Subcommittee; Jan. 26, 2011.

* cited by examiner

Relay open

$V_M = V_{TH}$ $I_M = 0$

Relay closed

$V_M = I_M R_{EWH}$ $$I_M = \frac{V_{TH}}{Z_{TH} + R_{EWH}}$$

⇓

$$Z_{TH} = \left( \frac{V_{TH}}{I_M} \right) - R_{EWH}$$

WHOLE HOUSE AND POWER SYSTEM ANALYSIS VIA GRID CONNECTED APPLIANCE

This application claims the benefit of U.S. Provisional Application No. 62/152,418 filed Apr. 24, 2015 and titled “WHOLE HOUSE AND POWER SYSTEM ANALYSIS VIA GRID CONNECTED APPLIANCE”. U.S. Provisional Application No. 62/152,418 filed Apr. 24, 2015 is incorporated herein by reference in its entirety.

BACKGROUND

The following relates to the electric power arts, energy conservation arts, electric system monitoring and maintenance arts, and related arts.

Historically, electrical power grids have operated on a demand mode, in which the power grid provides a constant voltage from which electrical loads can draw power at any time. This requires substantial grid generating capacity, which must be adjusted in real-time as load increases or decreases. To mitigate such load variation, some electrical utilities provide various incentives to encourage users to perform “load shifting” in which electrical loads are preferentially operated during off-peak hours when the aggregate load capacity is lower. However, incentivizing load shifting is a relatively slow process and cannot respond to more rapid grid fluctuations.

In so-called “demand response” approaches, some automation is provided by which electrical loads are controlled remotely to help accommodate grid fluctuations. In a typical demand response system, each electrical load has a load controller that can cycle the load on or off, and/or adjust its power draw, based on control inputs received from the power grid operator or an associated entity. In a residential setting, some appliances that are Loads most suitable for demand response operation are those which have some energy storage capacity so that the load can provide service to the end-user via the stored energy when not receiving electrical power, or conversely can receive electrical power and store it for later use. In a residential setting, some suitable demand response loads include electric water heaters which store thermal energy in the hot water tank, and electric air conditioners which can store thermal energy in the form of a cooled room. Another type of electrical load that may be suitable for demand response operation is a load whose time of running is flexible—in the residential setting, such a load is an electric dish washer that may be loaded with dishes and set up to run in the evening, but may actually run at any time overnight.

Demand response systems bias residential electrical power draw toward a schedule that accommodates the utility company. This however must be balanced against the needs/desires of the resident/user. For example, an electric water heater under demand response operation should still turn on in response to the water temperature falling below the bottom of the dead band so as to ensure the supply of hot water, and conversely should turn off in response to the water temperature rising above the top of the dead band to avoid outputting overheated or scalding-hot water. More sophisticated approaches for accommodating user interest may attempt to anticipate the user's needs—for example, the demand response system may bias against operating a water heater whose water temperature is near the top of (but still within) the dead band, and conversely may bias toward operating a water heater whose temperature is near the bottom of (but still within) the dead band.

BRIEF SUMMARY

In accordance with some illustrative embodiments disclosed herein, a residential electrical system is disclosed. A residential electric power distribution system is arranged to distribute a.c. electric power in a residence. A residential electrical load is connected via power input terminals to draw a.c. electric power from the residential electric power distribution system. A load controller is operatively connected with the residential electric load to regulate electric power drawn by the residential electrical load from the residential electric power distribution system. The operative connection includes operative connection to measure voltage ($V_M$) and electric current ($I_M$) at the power input terminals. The load controller includes a microprocessor or microcontroller programmed to compute a source impedance of the residential electric power distribution system as seen from the power input terminals from measured voltage ($V_M$) and electric current ($I_M$) at the power input terminals. In some embodiments the load controller is programmed to compute the source impedance by operations including: (i) determining an equivalent source voltage ($V_{TH}$) as equal to measured voltage ($V_M$) at the power input terminals when the electric current at the power input terminals is zero; and (ii) computing the source impedance ($Z_{TH}$) from measured non-zero electric current ($I_M$) at the power input terminals in combination with at least the equivalent source voltage ($V_{TH}$).

In accordance with some illustrative embodiments disclosed herein, a load controller is configured for operative connection with a residential electric load to regulate electric power drawn by the residential electrical load from a residential a.c. electric power distribution system via power input terminals of the residential electrical load. The load controller includes a voltmeter connected to measure voltage at the power input terminals, an ammeter connected to measure electric current at the power input terminals, and a microprocessor or microcontroller programmed to compute a source impedance of the residential a.c. electric power distribution system as seen from the power input terminals using measured voltage and electric current at the power input terminals. In some embodiments the microprocessor or microcontroller is programmed to compute the source impedance by operations including: (i) determining an equivalent source voltage as equal to measured voltage at the power input terminals when the electric current at the power input terminals is zero; and (ii) computing the source impedance from measured non zero electric current at the power input terminals in combination with at least the equivalent source voltage.

In accordance with some illustrative embodiments disclosed herein, a residential electrical power method is disclosed. Using a residential electric power distribution system, a.c. electric power is distributed in a residence including powering a residential electrical load connected via power input terminals to draw a.c. electric power from the residential electric power distribution system. Using a load controller operatively connected with the residential electric load, electric power drawn by the residential electrical load from the residential electric power distribution system is regulated. Voltage ($V_M$) and electric current ($I_M$) are measured at the power input terminals. Using a microprocessor or microcontroller of the load controller, a source impedance of the residential electric power distribution system as seen from the power input terminals is computed from measured voltage ($V_M$) and electric current ($I_M$) at the power input terminals. In some embodiments the method further includes detecting changes in loading of the residential electric power distribution system over time based on change over time of the computed source impedance of the residential electric power distribution system as seen from the power input terminals, and identifying a different residential electric load, other than the residential electric load, being turned on or off based on the detected changes in loading of the residential electric power distribution system over time.

DETAILED DESCRIPTION

It is disclosed herein to adapt a load controller provided with a demand response residential electrical load to provide diagnostic information about the residential power distribution system. This diagnostic information can be used for various purposes, such as providing the grid with information about the reactive load of the residence for use in volt-var optimization (VVO). In an electrical power system, the real (or active) power delivered to the load is measured in volt units (or kilovolt, etc) while the reactive power is measured in volt-ampere reactive (var) units. For highest energy efficiency, the power factor should be close to unity, i.e. the reactive power should be close to zero. However, some demand response systems are designed to leverage non-zero reactive power in various ways. In either case, information on the load imposed on the grid by the residence is useful in the VVO.

Other uses of diagnostic information about the residential power distribution system include detecting changes possibly predictive of an impending equipment failure, providing data to the electrical utility company for load analysis and/or market research, or to detect activation/deactivation of electrical loads in the residence.

Figure 1:
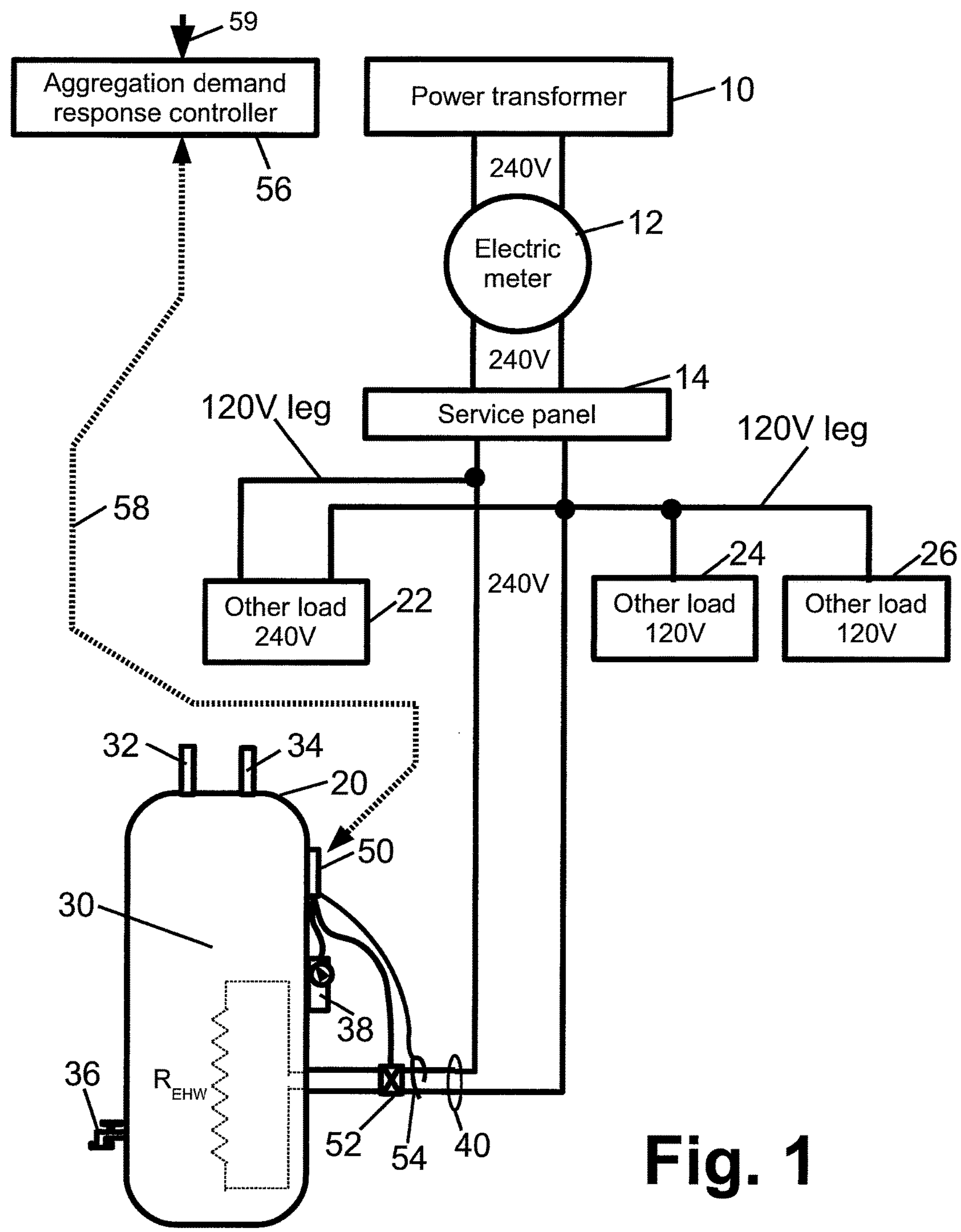
FIG. 1 diagrammatically illustrates a residential electrical power distribution system with voltage levels typical in North America, which includes an electric water heater with a grid-interactive controller and various other electrical loads. Also diagrammatically shown in FIG. 1 is an illustrative demand response control source that communicates with a demand response load controller of the water heater via a diagrammatically indicated communication link or network.

With reference to FIG. 1, a typical residential electrical power distribution system is shown, which receives power from a power transformer 10 that delivers a.c. electrical power to the residence via an electric meter 12 and a service panel 14. The residence may be a single-dwelling residence such as a house or a single apartment unit, or the residence may be a multi-dwelling residence such as an apartment building or dormitory. The illustrative example of FIG. 1 employs residential voltages that are typical in North America, i.e. a 240 V transformer output obtained between two phases of the three-phase power delivered by the electric power grid, and either 240 V (line-to-line) or 120 V (line-to-neutral, i.e. labeled as "120 V leg" in FIG. 1 where the neutral wiring is not illustrated for conciseness). Adaptation to other regions, such as Europe, which employ different standard voltages for the power grid, is straightforward.

FIG. 1 further diagrammatically illustrates two 240 V electric loads, namely an electric water heater 20 and an additional 240 V load 22 shown to illustrate that there may be more than one such load powered by the service panel 14. The additional 240 V load 22 may, for example, be an electric air conditioner, an electric laundry washer and/or dryer, or so forth. Additionally, two 120 V electric loads 24, 26 are shown for illustrative purposes, each powered between one of the illustrated 120 V legs and the neutral (not shown). It is to be understood that additional or fewer 240 V loads and/or additional or fewer 120 V loads may be similarly connected to the service panel 14. Moreover, it is contemplated to additionally connect one or more 120 V loads to the second 120 V leg which in illustrative FIG. 1 connects only with the 240 V loads 20, 22.

With continuing reference to FIG. 1, the illustrative electric water heater 20 includes a water tank 30, a cold water inlet pipe 32, a hot water outlet pipe 34, a manually operable drain valve 36 for training the water tank 30 (for maintenance or removal of the water heater 20), and an electronics unit 38 including a thermostat and heater control unit which drive one or more resistive heaters which are internal to the water tank 30 and are diagrammatically indicated in FIG. 1 by a conventional resistance electric circuit symbol labeled by the effective resistance $R_{EWH}$ of the heaters as seen from power input terminals 40 of the electric water heater 20.

It should be noted that the term "power input terminals" 40 as used herein does not necessarily refer to any particular terminal elements such as a wallplug, pigtail, or the like, but rather the term "power input terminals" 40 as used herein designates the electrical structure via which electrical power is delivered to the water heater 20, and more particularly to the heater(s) with effective resistance $R_{EWH}$. This structure might include a wallplug, pigtail or the like, but also includes electrical conductors, e.g. wires possibly bundled as a cable, via which the electrical power is delivered.

The illustrative electric water heater 20 is an illustrative demand response load—to this end, the electric water heater 20 includes or is operatively connected with a load controller 50, which comprises an electronic data processing and control device which includes a microprocessor, microcontroller, or other digital electronics and ancillary components such as a read-only memory (ROM), flash memory, or so forth. The illustrative load controller 50 is mounted to the water tank 30 of the electric water heater 20, but in other embodiments the load controller may be physically separate from the electric water heater, for example mounted on a wall near the water heater or on a pipe connected with or near to the water heater. The load controller 50 is operatively connected with the electric water heater 50 to regulate power drawn by the electric water heater 20. In the illustrative embodiment, the operative connection includes the following: (1) a wired connection of the load controller 50 with the electronics unit 38 (which may be an analog connection and/or a digital connection, e.g. a USB connection, depending upon the nature and connectivity options of the electronics unit 38) enabling reading of the water heater thermostat (at least the current water temperature, and optionally also the current temperature set point and possibly other parameters such as dead band settings); (2) a power relay 52 interposed on the power input terminals 40 of the electric water heater 20 which can be opened or closed by an electric control signal output by the load controller 50, where opening the power relay 52 operatively disconnects the heater(s) from the service panel 14 (note that the power relay 52 may be an electromechanical relay such as a solenoid relay, or may be a solid state relay (SSR) that uses a thyristor, TRIAC, or other semiconductor device to perform the switching); and (3) a power meter 54 connected to the load controller 50 by which the load controller 50 can read the voltage across the power input terminals 40 and the electric current flowing in the power input terminals 40. The power meter 54 may, for example, include a clamp-on ammeter placed around the power input terminals 40, a voltmeter wired to the power input terminals 40, or so forth. Additionally or alternatively, the electronics unit 38 of the electric water heater 20 may include voltage, current, and/or power metering capability and the load controller 50 then may read voltage, current, and/or power values from the electronics unit 38 by the wired connection with the electronics unit 38 (in this case the separate power meter 54 may be omitted). Other variants are contemplated, such as providing a separate thermocouple or other water temperature sensor for the load controller (in which case it is possible that there may be no connection with the electronics unit 38).

In operation, the illustrative load controller 50 receives a demand response control signal from the power grid, or from a demand response control entity 56 via a wireless connection (e.g. WiFi, 3G, 4G, etc), power line communication (PLC) link, or other communication network or link 58. Based on the received control signal, and/or based on an assessment of the current state of the water heater 20 performed at the load controller 50 based on sensor inputs such as the water temperature and the thermostat set point, the load controller determines whether the electric water heater 20 should be connected to draw power (in which case the power relay 52 is closed, or kept closed, by the load controller 50) or should be disconnected from the service panel 14 (in which case the power relay 52 is opened, or kept open, by the load controller 50). In some such embodiments, the set point of the thermostat of the electronics unit 38 of the water heater 20 is set so that the bottom of the dead band is higher than the highest water temperature desired by the residential user, so that the thermostat of the electronics unit 38 is "always on" and the load controller 50 is then in full control and can turn the water heater 20 on or off via operation of the power relay 52.

In some illustrative embodiments, the demand response residential load 20 is a member of an aggregation of demand response residential loads, and the demand response control entity 56 is an aggregation demand response controller in communication with the residential loads (including the load 20) via the communication link or network 58. In some such embodiments, the load controller 50 communicates information to the aggregation controller 56, via pathway 58, about its state and energy draw requirement over some forecast time interval, for example by specifying an urgency metric (e.g. in the range [0,1] where "0" means the load 20 cannot run and "1" means the load 20 must run) and a power draw value (e.g. in kilowatts; alternatively, this may be stored at the aggregation controller 56 for each load of the aggregation). The aggregation controller 56 receives an Automatic Generation Control (AGC) signal (suitable for use in frequency control), a load shift request signal, or other demand response control signal 59 indicating a desired power draw of the aggregation. The demand response control signal 59 is generated by the utility company, a grid operator, or other entity designated as managing demand response. Based on the demand response control signal 59 and state information received from the residential loads of the aggregation, the aggregation controller 56 designates a sub-set of the loads of the aggregation to operate in order to satisfy the power draw indicated by the demand response control signal 59. In one approach, the loads of the aggregation are ranked from highest urgency metric to lowest, and a cutoff point is determined in this ranking such that loads above the cutoff (hence with highest urgency) are instructed to run while loads below the cutoff (hence with lower urgency) are instructed to not run. In this illustrative approach, the cutoff point is chosen such that the sum of the power draws of all loads above the cutoff point equals the total aggregation power draw called for by the demand response control signal 59.

Again, these are merely some illustrative examples, and other demand response implementation approaches are contemplated. For example, in some approaches the instruction to turn on or off is received via the link 58 directly from the utility company, without the intermediary demand response controller 56—e.g., the utility may directly instruct all loads of a certain type in a certain geographical area to turn off for a brief period to alleviate an overload condition. As a further illustrative example, no demand response control signal may be employed at all—rather, in these embodiments the demand response load controller 50 is programmed to operate on a predetermined schedule chosen to satisfy anticipated demand response needs of the electric power utility. In a variant of this latter approach, the communication link or network 58 may be used to download this predetermined schedule from the electric utility to the load controller, and the communication link or network 58 may then be further used to download updates to the predetermined schedule from the electric utility on an occasional basis, for example to update the schedule for different seasons of the year, or to change the schedule from a weekday schedule to a weekend schedule.

It is to be further appreciated that the illustrative load controller 50 and its operative connections 52, 54 with the water heater 20 is merely an illustrative example, which is particularly well-suited for retro-fitting an existing water heater for demand response operation. Numerous other control paradigms are contemplated. As one further example, the load controller may be integrated with the electronics unit 38 of the electric water heater 20, which may be a suitable approach if the as-manufactured water heater is designed for demand response operation. In such an embodiment in which the water heater has integral demand response functionality, the load controller 50 may directly operate the thermostat and/or the heater control circuitry to turn the water heater on or off. Regardless of the control paradigm implemented by the load controller, in order to implement the disclosed residential power distribution system diagnostics the load controller 50 should be able to read the voltage and current on the power input terminals 40 that deliver operational power to the electric water heater 20. In some embodiments, it is also useful for the load controller to be able to create an open circuit condition at the power input terminals 40, e.g. by way of the illustrative external electromechanical or solid state power relay 52 or by an operative equivalent that is integral to the water heater, such as a SSR employing a thyristor, TRIAC or other solid state switching element that is built into the water heater.

Figure 2:
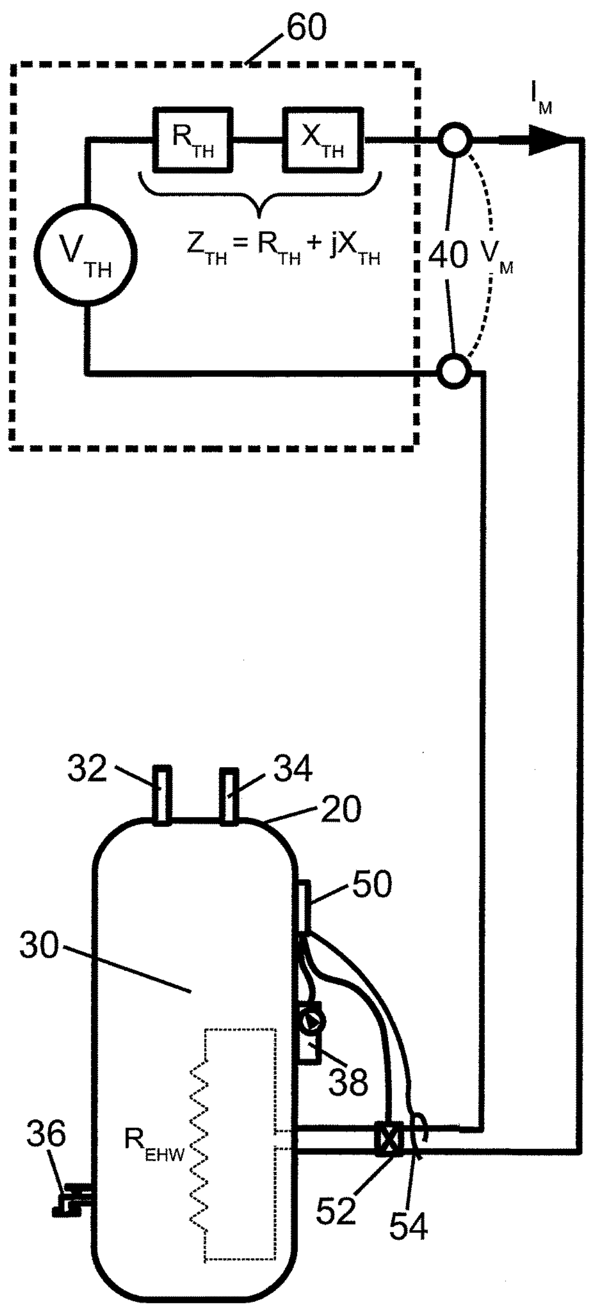
FIG. 2 diagrammatically illustrates the electric water heater of FIG. 1 in operative connection with a source impedance and (equivalent) voltage source representing the residential electrical power distribution system of FIG. 1 as seen from the power input terminals of the electric water heater.

With continuing reference to FIG. 1 and with further reference to FIG. 2, the disclosed residential power distribution system diagnostics operate by measuring the source impedance as seen from the power input terminals 40. The source impedance is the Thévenin equivalent impedance looking back toward the service panel 14 from the power input terminals 40 of the electric water heater 20. The "source impedance" is sometimes referred to by other terms in the art, such as "output impedance" (this terminology can be understood as viewing the electrical power as being "output" from the terminals 40 into the load 20). FIG. 2 illustrates the Thévenin equivalent 60 of the residential electrical power distribution system as seen from the power input terminals 40 of the electric water heater 20. The Thévenin equivalent circuit 60 is constructed using Thévenin's theorem, which in the a.c. power case states that any linear electrical network with a voltage source and only linear impedances can be replaced at designated terminals (here, the power input terminals 40 of the water heater 20) by an equivalent voltage source $V_{TH}$ in series connection with an equivalent (i.e. source) impedance $Z_{TH}$ where the source impedance $Z_{THR}=R_{TH}+jX_{TH}$ in general includes a real (i.e. resistive) component $R_{TH}$ and an imaginary (i.e. reactive) component $X_{TH}$. The reactive component $X_{TH}$ may in general be positive (inductive), negative (capacitive), or zero (corresponding to a power factor of unity). As further illustrative notation, the voltage across the power input terminals 40 is designated as $V_M$ (that is, the voltage measured across the terminals 40 by the load controller 50) and the electric current flowing in the power input terminals 40 is designated as $I_M$ (the current measured in the terminals 40 by the load controller 50).

As indicated in the equations annotated to FIG. 2, with these designations the following relationships can be developed. When the power relay 52 is open, it follows that:

$$V_M=V_{TH} \text{ and } I_M=0 \tag{1}$$

That is, the open circuit measurement of $V_M$ across the power input terminals 40 provides the Thévenin equivalent voltage $V_{TH}$. On the other hand, if the power relay 52 is closed then $V_M=I_M R_{EWH}$ from Ohm's law (where again $R_{EWH}$ is the effective resistance of the electric water heater 20), and:

$$I_M = \frac{V_{TH}}{Z_{TH} + R_{EWH}} \tag{2}$$

which can be rearranged to yield the source impedance $Z_{TH}$ according to:

$$Z_{TH} = \frac{V_{TH}}{I_M} - R_{EWH} \tag{3}$$

so that the source impedance $Z_{TH}$ is obtained from measuring the electric current $I_M$ with the power relay 52 closed and further using the Thévenin equivalent voltage $V_{TH}$ obtained by measuring $V_M$ with the power relay 52 open. Note that in accordance with Thévenin's theorem, the values of $V_{TH}$ and $Z_{TH}$ do not change as the power relay 52 is cycled open or closed. Expression (3) also relies upon knowing the value of $R_{EWH}$, but this can be measured using Ohm's law as $R_{EWH}=V_M/I_M$ with power relay 52 closed.

Applying Expression (3) is most easily done if the relay 52 is directly controlled by the load controller 50 so that the open-circuit voltage measurement can be performed directly. If there is no abrupt "on/off" control but the voltage $V_M$ and current $I_M$ are monitored over time and the load is occasionally powered completely down (so that $I_M=0$ at some point during the load cycling), then Expression (1) can be applied at the zero-current point(s) to determine $V_{TH}$ so that Expression (3) can then be evaluated.

In the most general case, the load is not turned on/off and is not necessarily turned off. Further generalizing to designate the load as an impedance $Z_L$ which may have a reactive component, and which may vary over time, the relationship:

$$Z_L = \frac{V_M}{I_M} \tag{4}$$

holds at all instants. Then the following linear relationship can be written:

$$V_{TH}=I_M(Z_{TH}+Z_L)=I_M Z_{TH}+V_M \tag{5}$$

or $$V_M=V_{TH}-I_M Z_{TH} \tag{6}$$

Equation (6) is the voltage-current ($V_M$-$I_M$) characteristic. Thus, by applying linear regression to the voltage-current characteristic $V_M$-$I_M$ obtained by sampling over time during demand mode operation, the intercept (setting $I_M=0$) in Expression (6) yields $V_{TH}$, and the slope ($-Z_{TH}$) yields the source impedance $Z_{TH}$ In the foregoing, it is assumed that the residential power distribution system remains static, in which case the values of $V_{TH}$ and $Z_{TH}$ can be treated as constants. This is correct only if the other loads 22, 24, 26 have constant power draw. In practice, these loads 22, 24, 26 are likely to be turned on or off as the residential user dictates, or as controlled by some control paradigm, e.g. an electric air conditioner cycles on/off to control the room temperature. When a load (other than the load 20) changes, the source impedance $Z_{TH}$ in general will change, and the Thévenin equivalent voltage $V_{TH}$ may also change. As the load controller 50 can measure these parameters periodically, such changes can be tracked essentially in real time, or at least on the time scale of the on/off cycling of the demand response electric load 20. Changes in these values tracked over time can be used to develop signatures for various (other) loads 22, 24, 26 being turned on or off. Other applications include detecting source impedance changes, transformer flicker, or the like. The angle $\cos^{-1}(X_{TH}/R_{TH})$ yields the power factor, and hence the var/volt ratio, and this information can be supplied to the electric utility, e.g. via the communication link or network 58, for use in volt-var optimization (VVO). More generally, the residential power distribution system data acquired can be supplied to the electric utility via the link or network 58 for use in load analysis, market research, or the like. The information can also (or alternatively) be supplied to a "smart home" control system for use in local residence electrical control.

It should be noted that the disclosed approach for characterizing the residential power distribution system may employ any type of load having a load controller that can measure current and voltage at the power input terminals of the load. The load is preferably resistive, although as noted the load can also have a reactive component accommodated by a general load impedance It will further be appreciated that the processing performed by the load controller 50 may also be embodied as a non-transitory storage medium storing instructions readable and executable by the load controller 50 to perform the disclosed residential electrical distribution system monitoring. The non-transitory storage medium may, for example, comprise a hard disk drive or other magnetic storage medium; a read-only-memory (ROM), erasable programmable read-only-memory (EPROM), flash memory, or other electronic storage medium; an optical disk or other optical storage medium; various combinations thereof; or so forth.

The preferred embodiments have been illustrated and described. Obviously, modifications and alterations will occur to others upon reading and understanding the preceding detailed description. It is intended that the invention be construed as including all such modifications and alterations insofar as they come within the scope of the appended claims or the equivalents thereof.

The invention claimed is:

1. A residential electrical system comprising:

a residential electric power distribution system arranged to distribute a.c. electric power in a residence;

a residential electrical load connected via power input terminals to draw a.c. electric power from the residential electric power distribution system;

a load controller operatively connected with the residential electric load to regulate electric power drawn by the residential electrical load from the residential electric power distribution system wherein the operative connection includes operative connection to measure voltage ($V_M$) and electric current ($I_M$) at the power input terminals;

wherein the load controller includes a microprocessor or microcontroller programmed to compute a source impedance of the residential electric power distribution system as seen from the power input terminals from measured voltage ($V_M$) and electric current ($I_M$) at the power input terminals.

2. The residential electrical system of claim 1 wherein the load controller is programmed to compute the source impedance by operations including:

(i) determining an equivalent source voltage ($V_{TH}$) as equal to measured voltage ($V_M$) at the power input terminals when the electric current at the power input terminals is zero; and (ii) computing the source impedance ($Z_{TH}$) from measured non-zero electric current ($I_M$) at the power input terminals in combination with at least the equivalent source voltage ($V_{TH}$).

3. The residential electrical system of claim 2 further comprising:

a power relay interposed on the power input terminals;

wherein the operation (i) includes opening the power relay to set the electric current at the power input terminals to zero.

4. The residential electrical system of claim 2 wherein the operation (i) includes monitoring the measured electric current ($I_M$) at the power input terminals to detect when the electric current at the power input terminals is zero.

5. The residential electrical system of claim 2 wherein the operation (ii) comprises computing the source impedance ($Z_{TH}$) from non-zero electric current ($I_M$) and voltage ($V_M$) measured at the power input terminals at the same time in combination with the equivalent source voltage ($V_{TH}$).

6. The residential electrical system of claim 2 wherein the residential electrical load is an electric water heater and the operation (ii) comprises computing the source impedance ($Z_{TH}$) from measured non-zero electric current ($I_M$) at the power input terminals in combination with the equivalent source voltage ($V_{TH}$) and a known resistive load ($R_{EWH}$) of the electric water heater.

7. The residential electrical system of claim 2 wherein the operation (ii) comprises computing the source impedance ($Z_{TH}$) from a voltage-electric current ($V_M$-$I_M$) characteristic measured at the power input terminals in combination with the equivalent source voltage ($V_{TH}$).

8. The residential electrical system of claim 1 wherein the load controller is programmed to compute the source impedance by computing a Thévenin equivalent circuit of the residential electric power distribution system as seen from the power input terminals from measured voltage ($V_M$) and electric current ($I_M$) at the power input terminals.

9. The residential electrical system of claim 1 wherein the load controller is further programmed to detect changes in loading of the residential electric power distribution system over time based on change over time of the computed source impedance of the residential electric power distribution system as seen from the power input terminals.

10. The residential electrical system of claim 1 wherein the load controller is further programmed to regulate electric power drawn by the residential electrical load in accordance with one of (1) a predetermined demand response schedule downloaded to the load controller via a communication network or link and (2) a demand response control signal received at the load controller via a communication network or link.

11. A load controller configured for operative connection with a residential electric load to regulate electric power drawn by the residential electrical load from a residential a.c. electric power distribution system via power input terminals of the residential electrical load, the load controller comprising:

a voltmeter connected to measure voltage at the power input terminals;

an ammeter connected to measure electric current at the power input terminals; and a microprocessor or microcontroller programmed to compute a source impedance of the residential a.c. electric power distribution system as seen from the power input terminals using measured voltage and electric current at the power input terminals.

12. The load controller of claim 11 wherein the microprocessor or microcontroller is programmed to compute the source impedance by operations including:

(i) determining an equivalent source voltage as equal to measured voltage at the power input terminals when the electric current at the power input terminals is zero; and (ii) computing the source impedance from measured non-zero electric current at the power input terminals in combination with at least the equivalent source voltage.

13. The load controller of claim 12 further comprising:

a power relay configured to be interposed on the power input terminals;

wherein the operation (i) includes opening the power relay interposed on the power input terminals to set the electric current at the power input terminals to zero.

14. The load controller of claim 12 wherein the operation (i) includes monitoring the measured electric current at the power input terminals to detect when the electric current at the power input terminals is zero.

15. The load controller of claim 12 wherein the operation (ii) comprises computing the source impedance from non-zero electric current and voltage measured at the power input terminals at the same time in combination with the equivalent source voltage.

16. The load controller of claim 12 wherein the operation (ii) comprises computing the source impedance from measured non-zero electric current at the power input terminals in combination with the equivalent source voltage and a known load impedance of the residential electrical load.

17. The load controller of claim 12 wherein the operation (ii) comprises computing the source impedance from a voltage-electric current characteristic measured at the power input terminals in combination with the equivalent source voltage.

18. The load controller of claim 11 wherein the microprocessor or microcontroller is programmed to compute the source impedance by computing a Thévenin equivalent circuit of the residential electric power distribution system as seen from the power input terminals from measured voltage and electric current at the power input terminals.

19. The load controller of claim 11 wherein the microprocessor or microcontroller is further programmed to detect changes in loading of the residential electric power distribution system over time based on change over time of the computed source impedance of the residential electric power distribution system as seen from the power input terminals.

20. The load controller of claim 11 wherein the microprocessor or microcontroller is further programmed to regulate electric power drawn by the residential electrical load in accordance with a predetermined demand response schedule downloaded to the load controller via a communication network or link.

21. The load controller of claim 11 wherein the load controller is configured for connection with a communication network or link, and the microprocessor or microcontroller is further programmed to regulate electric power drawn by the residential electrical load in accordance with a demand response control signal received at the load controller via the communication network or link.

22. A residential electrical power method comprising:

using a residential electric power distribution system, distributing a.c. electric power in a residence including powering a residential electrical load connected via power input terminals to draw a.c. electric power from the residential electric power distribution system;

using a load controller operatively connected with the residential electric load, regulating electric power drawn by the residential electrical load from the residential electric power distribution system;

measuring voltage ($V_M$) and electric current ($I_M$) at the power input terminals; and using a microprocessor or microcontroller of the load controller, computing a source impedance of the residential electric power distribution system as seen from the power input terminals from measured voltage ($V_M$) and electric current ($I_M$) at the power input terminals.

23. The residential electrical power method of claim 22 wherein the computing comprises:

(i) determining an equivalent source voltage ($V_{TH}$) as equal to measured voltage ($V_M$) at the power input terminals when the electric current at the power input terminals is zero; and (ii) computing the source impedance ($Z_{TH}$) from measured non-zero electric current ($I_M$) at the power input terminals in combination with at least the equivalent source voltage ($V_{TH}$).

24. The residential electrical power method of claim 23 wherein the operation (i) includes one of:

opening a power relay interposed on the power input terminals to set the electric current at the power input terminals to zero; and monitoring the measured electric current ($I_M$) at the power input terminals to detect when the electric current at the power input terminals is zero.

25. The residential electrical power method of claim 23 wherein the operation (ii) comprises one of:

computing the source impedance ($Z_{TH}$) from non-zero electric current ($I_M$) and voltage ($V_M$) measured at the power input terminals at the same time in combination with the equivalent source voltage ($V_{TH}$); and computing the source impedance ($Z_{TH}$) from measured non-zero electric current ($I_M$) at the power input terminals in combination with the equivalent source voltage ($V_{TH}$) and a known load impedance (4) of the residential electrical load.

26. The residential electrical power method of claim 23 wherein the operation (ii) comprises:

generating a voltage-electric current ($V_M$-$I_M$) characteristic from measurements over time of the voltage ($V_M$) and electric current ($I_M$) at the power input terminals;

computing the source impedance ($Z_{TH}$) using the slope of the voltage-electric current ($V_M$-$I_M$) characteristic.

27. The residential electrical power method of claim 22 wherein the computing comprises:

computing a Thévenin equivalent circuit of the residential electric power distribution system as seen from the power input terminals from measured voltage ($V_M$) and electric current ($I_M$) at the power input terminals; and setting the source impedance of the residential electric power distribution system as seen from the power input terminals equal to the Thévenin impedance ($Z_{TH}$) of the Thévenin equivalent circuit.

28. The residential electrical power method of claim 22 further comprising:

detecting changes in loading of the residential electric power distribution system over time based on change over time of the computed source impedance of the residential electric power distribution system as seen from the power input terminals; and identifying a different residential electric load, other than the residential electric load, being turned on or off based on the detected changes in loading of the residential electric power distribution system over time.

* * * * *